United States Patent [19]

Miyamoto

[11] Patent Number: 5,407,862
[45] Date of Patent: Apr. 18, 1995

[54] METHOD FOR MANUFACTURING FINE-STRUCTURED STACKED CONNECTION LAYER

[75] Inventor: Hidenobu Miyamoto, Tokyo, Japan

[73] Assignee: NEC Corporation, Tokyo, Japan

[21] Appl. No.: 157,298

[22] Filed: Nov. 26, 1993

[30] Foreign Application Priority Data

Nov. 25, 1992 [JP] Japan .................................. 4-314487

[51] Int. Cl.6 ...................... H01L 21/44; H01L 21/48
[52] U.S. Cl. .................................. 437/192; 437/194; 437/195
[58] Field of Search .......................... 437/195, 192, 194

[56] References Cited

U.S. PATENT DOCUMENTS 5,100,838  3/1992  Dennison ............................ 437/195
5,262,352  11/1993  Woo et al. ............................ 437/189

OTHER PUBLICATIONS

M. Kobayashi et al., "Metal Etching Technology", Monthly Semiconductor World, Oct. 1991, pp. 116–119.

*Primary Examiner*—Olik Chaudhuri
*Assistant Examiner*—H. Jey Tsai
*Attorney, Agent, or Firm*—Sughrue, Mion, Zinn, Macpeak & Seas

[57] ABSTRACT

A first insulating layer is formed on a semiconductor substrate. A lower metal layer and a upper metal layer are sequentially formed on the first insulating layer, and also, a second insulating layer is formed thereon. Then, a photoresist pattern is formed, and the second insulating layer and the upper metal layer are etched with a mask of the patterned photoresist layer. Then, the patterned photoresist layer is removed, and a sidewall insulating layer is formed on a side of the upper metal layer. Finally, the lower metal layer is etched with a mask of the second insulating layer and the sidewall insulating layer.

16 Claims, 7 Drawing Sheets

METHOD FOR MANUFACTURING FINE-STRUCTURED STACKED CONNECTION LAYER

BACKGROUND OF THE INVENTION

1. Field of the Invention

The present invention relates to a method for manufacturing a semiconductor device, and more particularly, to a method for manufacturing a fine-structured connection layer.

2. Description of the Related Art

Recently, a semiconductor devices have been fine-structured. For example, a 0.5 μm rule is adopted in a 16 Mbit dynamic random access memory (DRAM), and a 0.3 to 0.35 μm rule will be adopted in a 64 Mbit DRAM. As semiconductor devices have become more fine-structured, metal connections, and openings such as contact holes and through holes have also become more fine-structured.

Although an aluminium metal connection layer has a high conductivity, the aluminium connection layer has a small life-time due to the stress migration caused by the fine-structure thereof. To avoid this, a stacked configuration metal layer has been suggested. For example, a double configuration metal layer is formed by a lower metal layer made of high melting temperature metal such as titanium tungsten and an upper metal layer made of high conductivity metal such as aluminium. Also, a triple configuration metal layer is formed by a lower metal layer made of high melting temperature metal such as titanium tungsten, a middle metal layer made of high conductivity metal such as aluminium, and an upper metal layer made of high melting temperature metal such as titanium tungsten. Further, in order to improve a step coverage characteristic for openings such as contact holes or through holes, a tungsten layer deposited by a chemical vapor deposition (CVD) process is inserted between the lower metal layer and the upper metal layer in the double configuration and between the lower metal layer and the middle metal layer in the triple configmation.

In a prior art method for manufacturing a stacked connection layer, a photoresist layer is coated on a stacked metal layer formed by at least a lower metal layer and an upper metal layer, and the photoresist layer is patterned by a photolithography process. Then, the upper metal layer is etched with a mask of the patterned photoresist layer, and after that, the lower metal layer is etched with a mask of the same pattern photoresist layer and the upper metal layer, which will be later explained in more detail.

In the above-mentioned prior art manufacturing method, since the patterned photoresist layer is exposed to etching gas at least twice, it is impossible to obtain an accurate selection ratio (etching ratio) of the final stacked connection layer to the insulating layer, as will be explained later. As a result, the size of the stacked connection layer is reduced as compared with that of the original patterned photoresist layer. Particularly, the width of the stacked connection layer is reduced so as to reduce the conductivity thereof, thus inviting stress migration.

Also, if an opening such as a contact hole or a through hole is provided and is connected to the lower metal layer, the patterned photoresist layer at a final etching process may be deviated from the location of the opening, as the etching process progresses. As a result, if a part of the lower metal layer filled in the opening may be etched, and also, at worst, if an impurity region formed within a semiconductor substrate at the opening may be etched, a defective connection such as a disconnection or low conductivity at a contact portion, an increase of junction leakage in the impurity region, a reduction of duration of a junction portion, and the like may occur.

Further, since the patterned photoresist layer is exposed to etching gas for a long time, the contact characteristic of the photoresist layer to the stacked connection layer is deteriorated, thus deteriorating the etching operation.

SUMMARY OF THE INVENTION

It is, therefore, an object of the present invention to provide a method for manufacturing an improved fine-structured stacked connection layer.

According to the present invention, a first insulating layer is formed on a semiconductor substrate. A lower metal layer and an upper metal layer are sequentially formed on the first insulating layer, and also, a second insulating layer is formed thereon. Then, a photoresist pattern is formed, and the second insulating layer and the upper metal layer are etched with a mask of the patterned photoresist layer. Then, the patterned photoresist layer is removed, and a sidewall insulating layer is formed on a side of the upper metal layer. Finally, the lower metal layer is etched with a mask of the second insulating layer and the sidewall insulating layer.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of an embodiment of the present invention, a prior art method for manucturing a stacked connection layer will be explained with reference to FIGS. 1A through 1F.

Figure 1A:
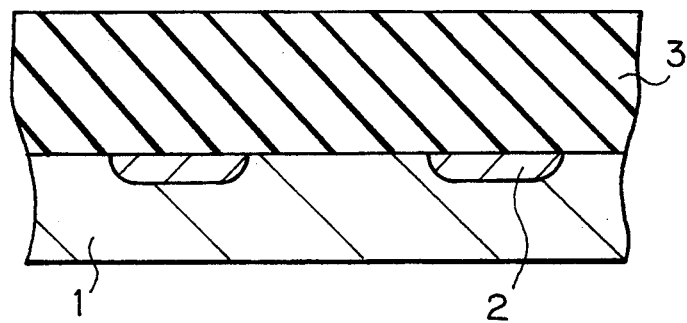
FIGS. 1A through 1F are cross-sectional views illustrating a prior art method for manufacturing a stacked connection layer.

As illustrated in FIG. 1A, an impurity region 2 is formed by introducing impurities into a semiconductor substrate 1, and an about 1 μm thick insulating layer 3 is deposited thereon.

Figure 1B:
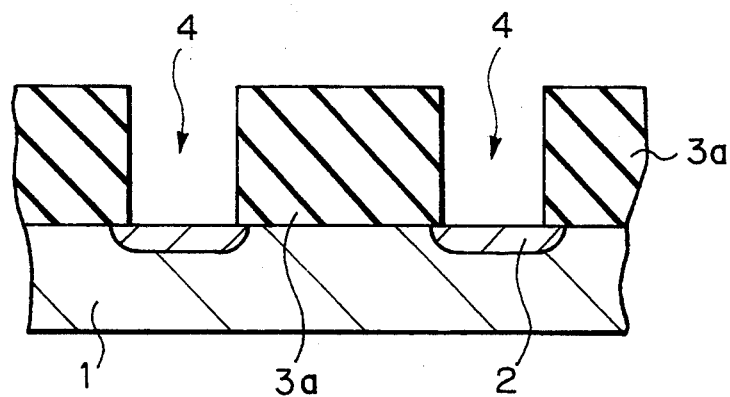

Next, as illustrated in FIG. 1B, an opening 4 is formed in the insulating layer 3 by a conventional photolithography process, to obtain an insulating layer 3a.

Figure 1C:
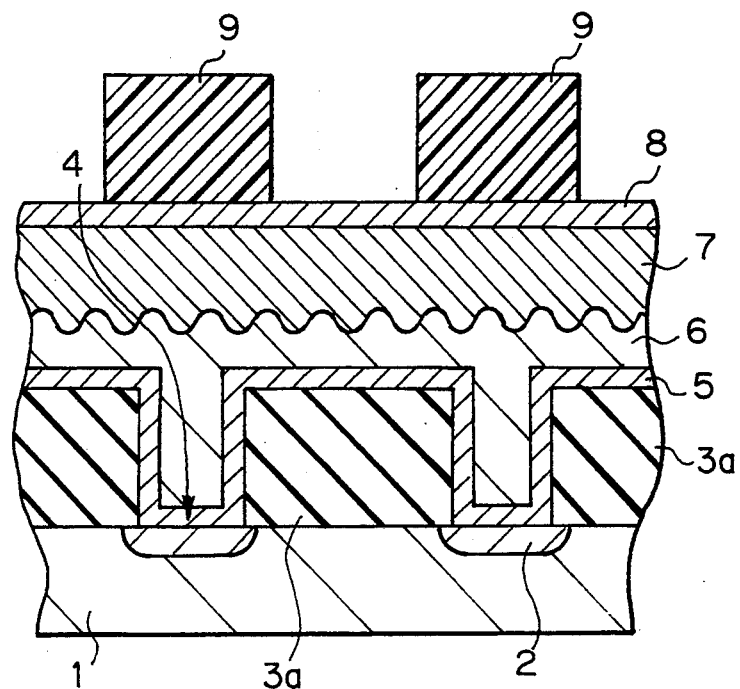

Next, as illustrated in FIG. 1C, an about 50 nm thick titanium tungsten (TiW) layer 5, an about 200 nm thick tungsten (W) layer 6, an about 500 μm thick aluminium (Al) alloy layer 7, and an about 100 nm thick titanium tungsten (TiW) layer 8 are sequentially deposited on the entire surface. Note that the titanium tungsten layer 5 and the tungsten layer 6, which both have high melting temperatures, serve as a lower metal layer; the aluminium alloy layer 7, which has a high conductivity, serves as a middle metal layer; and the titanium tungsten layer 8, which has a high melting temperature, serves as an upper metal layer. Also, the titanium tungsten layers 5 and 8 have a good contact characteristic for contact to an insulating layer such as 3.

Further, the tungsten layer 6 has a good step coverage characteristic for an opening such as 4. The tungsten layer 6 is deposited by CVD, but has a largely rough surface.

Then, a photoresist pattern layer 9 having a pattern of a connection layer is formed.

Figure 1D:
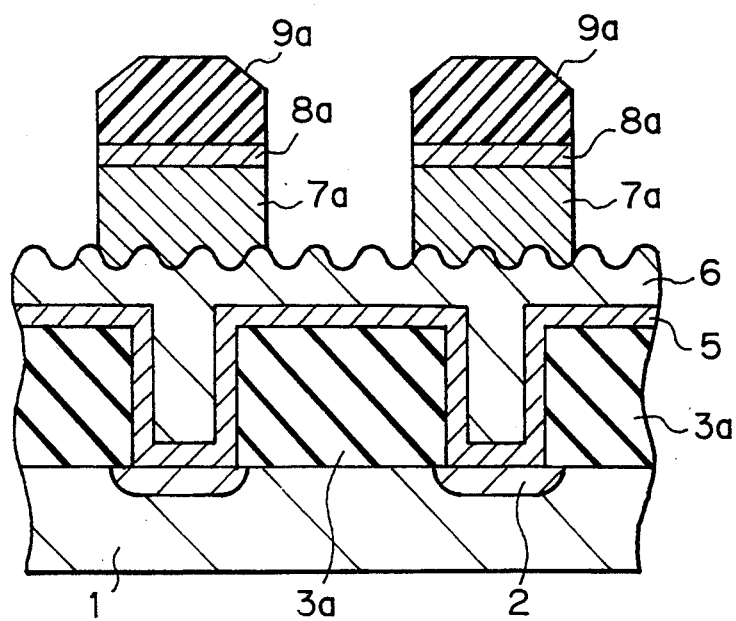

Next, as illustrated in FIG. 1D, the titanium tungsten layer 8 is anisotropically etched with a mask of the photoresist pattern layer 9 by plasma gas of $SF_6$ and $BCl_3$ on the condition that $SF_6$: $BCl_3$ = 30 sccm: 15 sccm; the gas pressure is 100 mTorr; and the RF power is 200W, thus obtaining a titanium tungsten layer 8a. Subsequently, the aluminium alloy layer 7 is anisotropically etched with a mask of the photoresist pattern layer 9 by plasma gas of $BCl_6$, $Cl_2$ and $N_2$ on the condition that $BCl_6$: $Cl_2$: $N_2$ = 70 sccm: 50 sccm: 20 sccm; the gas pressure is 150 mTorr; and the RF power is 500W, thus obtaining an aluminium alloy layer 7a. In this case, the photoresist pattern layer 9 per se is also etched, so that the photoresist pattern layer 9 is deformed into a photoresist pattern layer 9a.

Figure 1E:
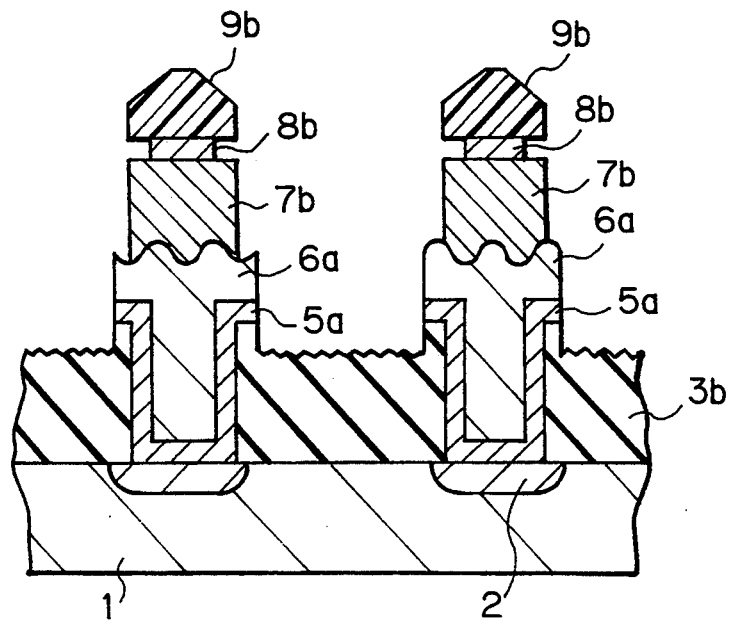

Next, as illustrated in FIG. 1E, the tungsten layer 6 and the titanium tungsten layer 5 are anisotropically etched with a mask of the photoresist pattern layer 9a, the titanium tungsten layer 8a and the aluminium alloy layer 7a, by plasma gas of $SF_6$ and $BCl_3$ or plasma gas of $SF_6$ and HBr, thus obtaining a tungsten layer 6a and a titanium tungsten 5a. In this case, the photoresist pattern layer 9a, the titanium tungsten layer 8a, and the aluminium alloy layer 7a are also etched, to obtain a photoresist pattern layer 9b, a titanium tungsten layer 8b and an aluminium alloy layer 7b.

Figure 1F:
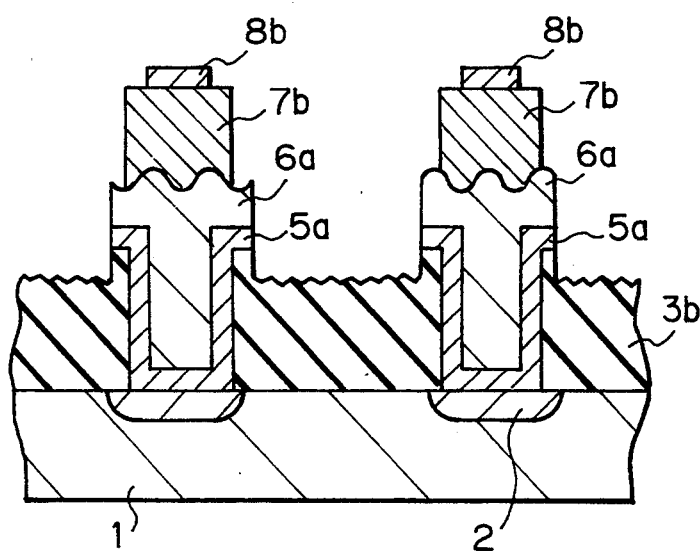

Finally, as illustrated in FIG. 1F, the photoresist pattern layer 9b is removed, thus completing a triple stacked connection layer including the CVD tungsten layer 6a.

In the above-mentioned prior art manufacturing method, when etching the lower metal layer formed by the tungsten layer 6 and the titanium tungsten layer 5, the photoresist pattern layer 9a is dissolved to create carbon particles therefrom which are dispersed into the plasma gas. Therefore, the dispersed carbon particles may be deposited to the exposed surface of the insulating layer 3a. As a result, the etching speed of the insulating layer 3a is accelerated. In other words, the selection ratio (etching ratio) of the insulating layer 3a to the titanium tungsten layer 5 (and the tungsten layer 6) is remarkably increased. Thus, as illustrated in FIG. 1E, the surface of the insulating layer 3b is remarkably rough.

If the above-mentioned selection ratio is not adequate, the sizes of the titanium tungsten layer 8b and the aluminium alloy layer 7b (see FIG. 1E) are reduced as compared with that of the original photoresist pattern layer 9 (see FIG. 1A). Particularly, the width of the titanium tungsten layer 8b and the aluminium alloy layer 5b is reduced so as to reduce the conductivity thereof, thus inviting stress migration.

Also, the photoresist pattern layer 9b at a final etching process (see FIG. 1E) may be deviated from the location of the opening 4. As a result, if a part of the titanium tungsten layer 5a filled in the opening 4 may be etched, and also at worst, if the impurity region 2 may be etched, a defective connection such as a disconnection or low conductivity at a contact portion, an increase of junction leakage in the impurity region 2, a reduction of duration of a junction portion, and the like may occur.

Further, since the patterned photoresist pattern layer 9 (9a, 9b) is exposed to etching gas for a long time, the contact characteristic of the photoresist pattern layer 9 (9a, 9b) for contact to the titanium tungsten layer 8 is deteriorated, thus deteriorating the etching operation.

FIGS. 2A through 2H are cross-sectional views illustrating an embodiment of the present invention.

Figure 2A:
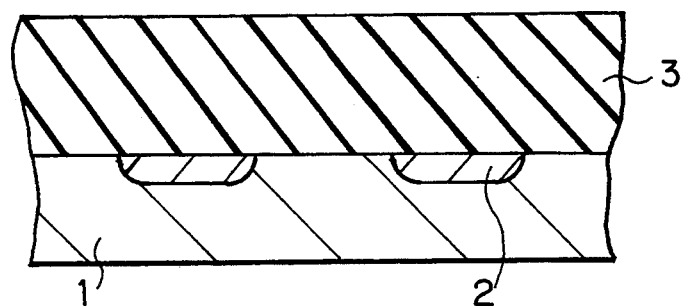
FIGS. 2A through 2H are cross-sectional views illustrating a method for manufacturing a stacked connection layer according to an embodiment of the present invention.
Figure 2B:
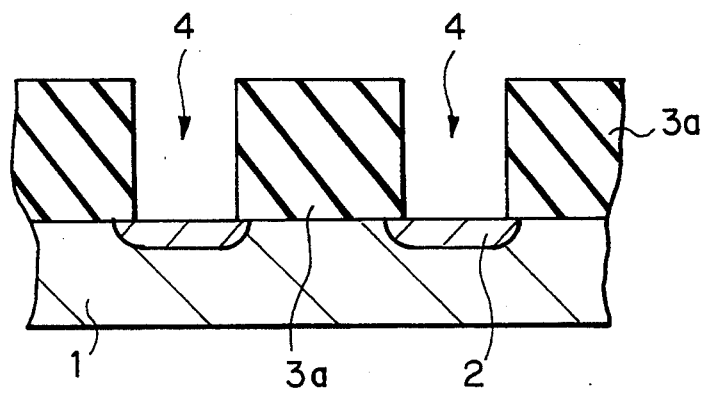

As illustrated in FIGS. 2A and 2B, which are the same as FIGS. 1A and 1B, respectively, an impurity region 2 is formed by introducing impurities into a semiconductor substrate 1, and an about 1 $\mu$m thick insulating layer 3 is deposited thereon. Next, an opening 4 is formed in the insulating layer 3 by conventional photolithography process, to obtain an insulating layer 3a.

Figure 2C:
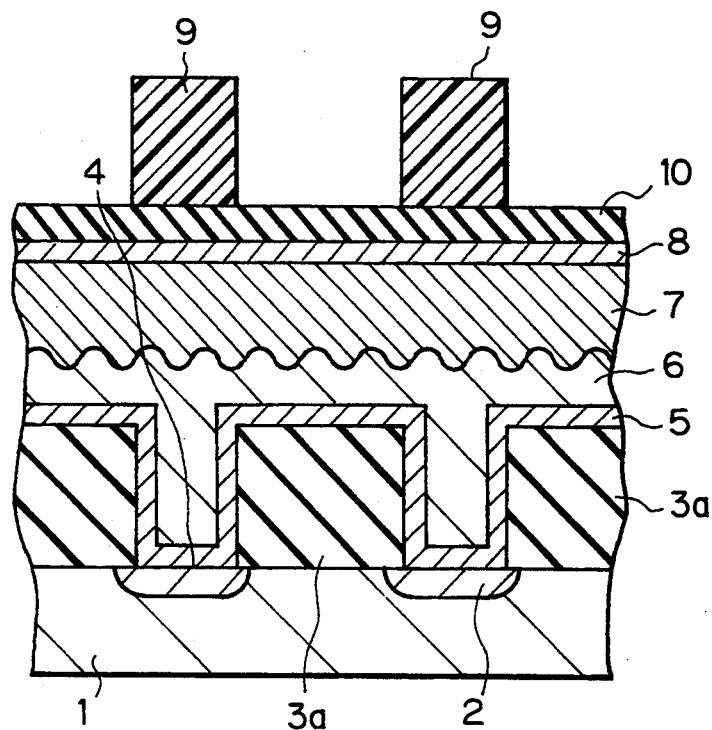

Next, as illustrated in FIG. 2C, which corresponds to FIG. 1C, an about 50 nm thick titanium tungsten (TiW) layer 5, an about 200 nm thick tungsten (W) layer 6, an about 500 $\mu$m thick aluminium (Al) alloy layer 7, and an about 100 nm thick titanium tungsten (TiW) layer 8 are sequentially deposited on the entire surface, in the same way as in FIG. 1C.

Then, an about 200 nm thick insulating layer 10 is formed by plasma CVD. This process is not shown in FIG. 1C. Thereafter, a photoresist pattern layer 9 having a pattern of a connection layer is formed.

Figure 2D:
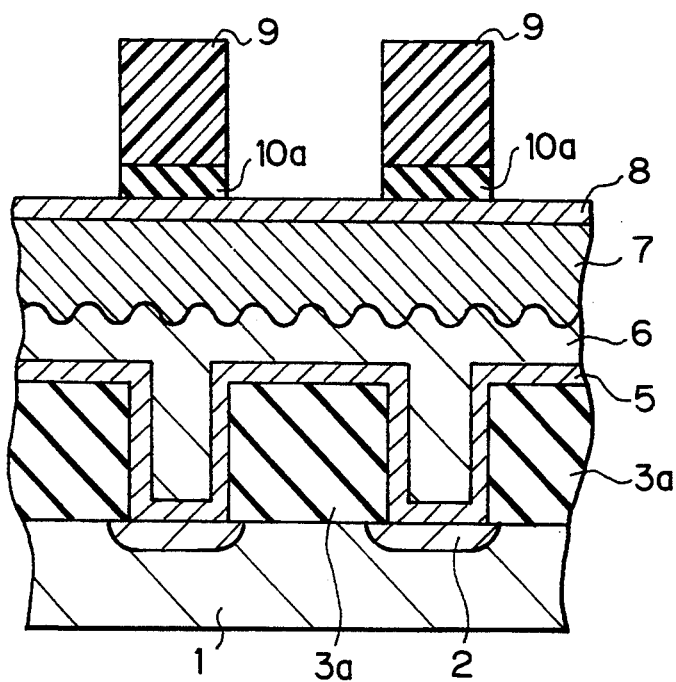

Next, as illustrated in FIG. 2D, the insulating layer 10 is anisotropically etched with the photoresist pattern layer 9, thus obtaining an insulating layer 10a.

Figure 2E:
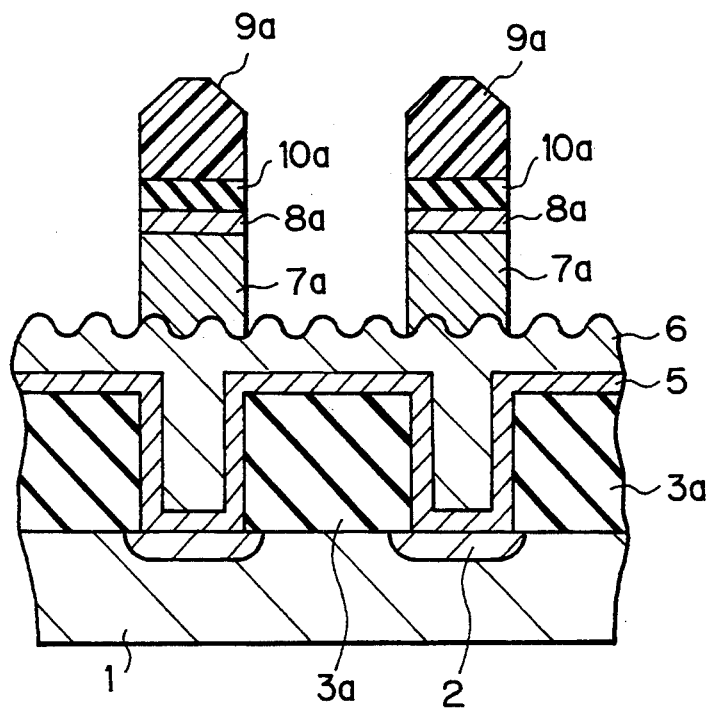

Next, as illustrated in FIG. 2E, the titanium tungsten layer 8 is anisotropically etched with a mask of the photoresist pattern layer 9 by plasma gas of $SF_6$ and $BCl_3$ on the condition that $SF_6$: $BCl_3$ = 30 sccm: 15 sccm; the gas pressure is 100 mTorr; and the RF power is 200W, thus obtaining a titanium tungsten layer 8a. Subsequently, the aluminium alloy layer 7 is anisotropically etched with a mask of the photoresist pattern layer 9 by plasma gas of $BCl_6$, $Cl_2$ and $N_2$ on the condition that $BCl_6$: $Cl_2$: $N_2$ = 70 sccm: 50 sccm: 20 sccm; the gas pressure is 150 mTorr; and the RF power is 500W, thus obtaining an aluminium alloy layer 7a. In this case, the photoresist pattern layer 9 per se is also etched, so that the photoresist pattern layer 9 is deformed into a photoresist pattern layer 9a.

Figure 2F:
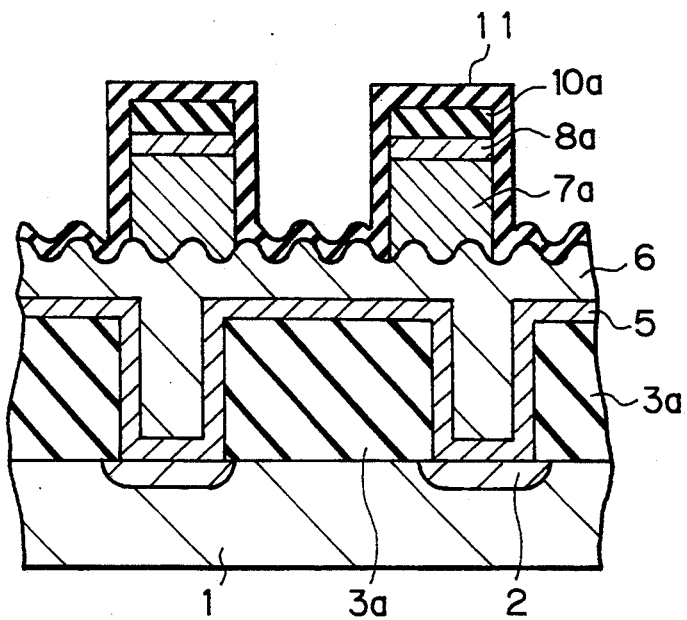

Next, as illustrated in FIG. 2F, the photoresist pattern layer 9a is removed. After that, an about 50 nm thick insulating layer 11 is formed by plasma CVD.

Figure 2G:
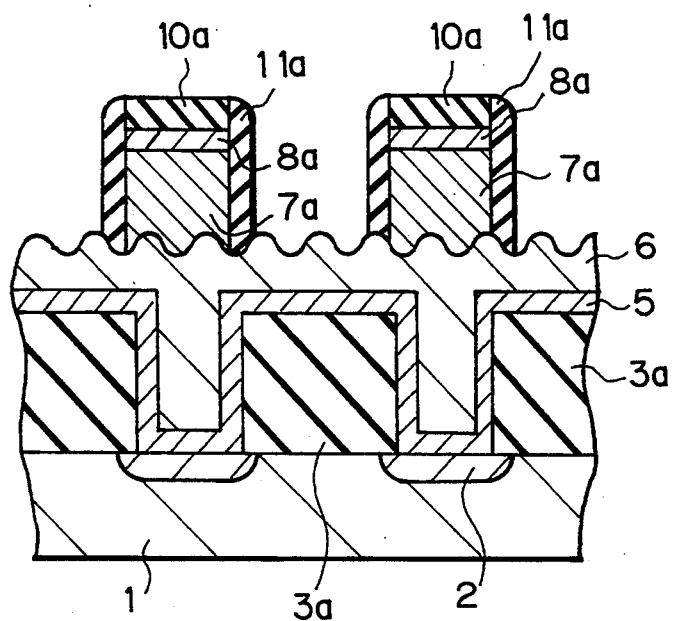

Next, as illustrated in FIG. 2G, the insulating layer 11 is etched back by plasma gas of $CF_4$, $CHF_3$ and Ar on the condition that $CF_4$: $CHF_3$: Ar = 20 sccm: 20 sccm: 20 sccm; the gas pressure is 300 mTorr; and the RF power is 500W, thus obtaining a sidewall insulating layer 11a on the side of the titanium tungsten layer 8a and the aluminium alloy layer 7a.

Figure 2H:
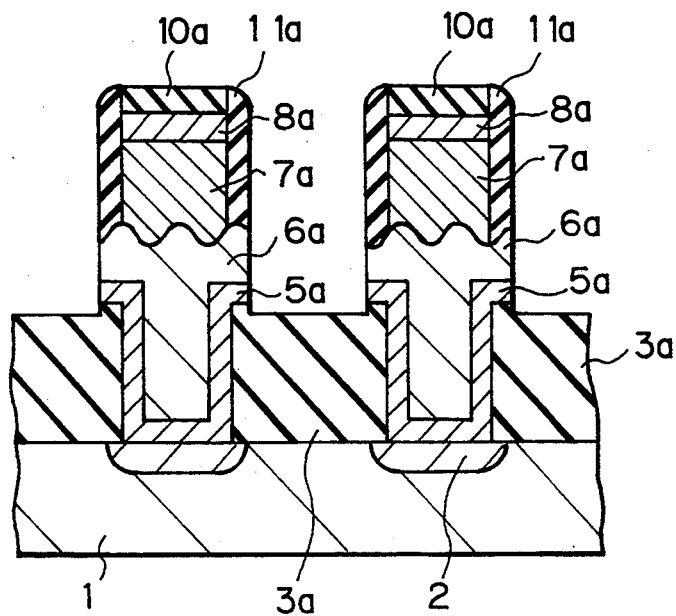

Finally, as illustrated in FIG. 2H, the tungsten layer 6 and the titanium tungsten layer 5 are anisotropically etched with a mask of the insulating layers 10a and the sidewall insulating layer 11a by plasma gas of HBr, $SF_6$ and $N_2$ on the condition that HBr: $SF_6$: $N_2$ = 60 sccm: 30 sccm: 20 sccm; the gas pressure is 100 mTorr; and the RF power is 300W, thus obtaining a tungsten layer 6a and a titanium tungsten 5a. Thus, a triple stacked connection layer including the CVD tungsten layer 6a is completed.

In the above-mentioned embodiment, at a stage for etching the tungsten layer 6 and the titanium tungsten layer 5, since the photoresist layer 9 (9a) is completely removed (see FIG. 2F), no carbon particles are generated therefrom, so that the etching speed of the insulating layer 3a is not accelerated. In other words, the selection ratio of the insulating layer 3a to the titanium tungsten layer 5a (the tungsten layer 6a) is accurately obtained.

Also, since an etching process using the photoresist pattern layer 9 is performed only on the insulating layer 10, the titanium tungsten layer 8 and the aluminium alloy layer 7, so that the width of the aluminium alloy layer 6a and the titanium tungsten layer 5a is substantially the same as that of the photoresist pattern layer 9.

Further, since the etching of the tungsten layer 6 and the titanium tungsten layer 5 is carried out by using a mask of the insulating layer 10a and the sidewall insulating layer 11a, the width of the tungsten layer 6a and the titanium tungsten layer 5a is not reduced, but is increased by twice the thickness of the sidewall insulating layer 11a.

Thus, according to the stacked connection layer formed by the layers 5a, 6a, 7a and 8a, its conductivity is not decreased and a stress migration hardly occus. Also, no defective connection, no junction leakage and no reduction of duration of a junction portion are generated.

Also, in the above-mentioned embodiment, although a lower metal layer is formed by the titanium tungsten layer 5a and the tungsten layer 6a, the lower metal layer can include at least one of titanium, titanium nitride, titanium tungsten, tungsten silicide and tungsten. Also, although an upper metal layer is formed by the titanium tungsten layer 8a, the lower metal layer can include at least one of titanium, titanium nitride, titanium tungsten, tungsten silicide and tungsten.

Further, the upper metal layer can be made of titanium-tungsten while the lower metal layer can be made of aluminium, aluminium-silicon alloy, aluminium-copper alloy, and aluminium-silicon-copper alloy, thus forming a double stacked connection layer.

Further, a 0.4 $\mu m \pm 0.05$ $\mu m$ rule can be applied to the embodiment as illustrated in FIGS. 2A through 2H. In this case, the radius of the opening 4 is made 0.4 $\mu m$, and the width of the photoresist pattern layer 9 is made 0.4 $\mu m$. Also, the thickness of the insulating layer 11 is made larger than 50 nm (=0.05 $\mu m$). Thus, in this case, the tungsten layer 6a is wider than the photoresist pattern layer 9 by 100 nm (0.10 $\mu m$), so that the tungsten layer 6a can completely cover the opening 4.

As explained hereinbefore, according to the present invention, the stacked connection layer can be more fine-structured without inviting stress migration, defective connection, or the like.

I claim:

1. A method for manufacturing a metal connection layer, comprising the steps of:
   forming an insulating layer on a semiconductor substrate;
   forming a lower metal layer on said insulating layer, said lower metal layer being made of high melting temperature metal including one of titanium, an alloy of titanium, tungsten and an alloy of tungsten;
   forming an upper metal layer on said lower metal layer, said upper metal layer being made of a non-high melting temperature metal including one of aluminium and an alloy of aluminium;
   forming a second insulating layer on said upper metal layer;
   forming a photoresist layer;
   patterning said photoresist layer;
   etching said second insulating layer and said upper metal layer with a mask of said patterned photoresist layer;
   removing said patterned photoresist layer;
   forming a sidewall insulating layer on a side of said etched upper metal layer; and
   etching said lower metal layer with a mask of said second insulating layer and said sidewall insulating layer.

2. A method as set forth in claim 1, further comprising the steps of:
   forming an impurity region in said semiconductor substrate; and
   forming an opening in said first insulating layer,
   said lower metal forming step forming said lower metal layer so that said lower metal layer reaches said impurity region.

3. A method as set forth in claim 1, wherein said high melting temperature metal comprises at least one of titanium, titanium nitride, titanium tungsten, tungsten silicide and tungsten.

4. A method as set forth in claim 1, wherein said non-high melting temperature metal comprises at least one of aluminium, aluminium silicon alloy, aluminium-copper alloy, and aluminium-silicon-copper alloy.

5. A method for manufacturing a metal connection layer, comprising the steps of:
   forming an insulating layer on a semiconductor substrate;
   forming a first metal layer having a high melting temperature on said insulating layer;
   forming a second metal layer having a non-high melting temperature on said first metal layer;
   forming a third metal layer having a high melting temperature on said second metal layer;
   forming a second insulating layer on said third metal layer;
   forming a photoresist layer;
   patterning said photoresist layer;
   etching said second insulating layer, said third metal layer, and said second metal layer with a mask of said patterned photoresist layer;
   removing said patterned photoresist layer;
   forming a sidewall insulating layer on a side of said third metal layer and said second metal layer; and
   etching said lower metal layer with a mask of said second insulating layer and said sidewall insulating layer,
   each of said first and third metal layers being made of a high melting temperature metal including at least one of titanium, a titanium alloy, tungsten and a tungsten alloy, said second metal layer being made of a non-high melting temperature metal including at lease one of aluminium and an aluminium alloy.

6. A method as set forth in claim 5, further comprising the steps of:
   forming an. impurity region in said semiconductor substrate; and
   forming an opening in said first insulating layer,
   said first metal forming step forming said lower metal layer so that said lower metal layer reaches said impurity region.

7. A method as set forth in claim 5, wherein said high melting temperature metal comprises at least one of titanium, titanium nitride, titanium tungsten, tungsten silicide and tungsten.

8. A method as set forth in claim 5, wherein said non-high melting temperature metal comprises at least one of aluminium, aluminium silicon alloy, aluminium-copper alloy, and aluminium-silicon-copper alloy.

9. A method for manufacturing a connection layer, comprising the steps of:

forming an impurity region in a semiconductor substrate;

forming a first insulating layer on the semiconductor substrate;

forming an opening in said first insulating layer, said opening reaching said impurity region;

forming first, second, third and fourth metal layers on said first insulating layer sequentially, said first metal layer being made of a high melting temperature metal, said second metal layer being made of a high melting temperature metal, said third metal layer being made of aluminium, said fourth metal layer being made of a high melting temperature metal;

forming a second insulating layer on said fourth metal layer;

forming a photoresist layer;

patterning said photoresist layer;

etching said second insulating layer and said fourth and third metal layers with a mask of said patterned photoresist layer;

removing said patterned photoresist layer;

forming a sidewall insulating layer on a side of said fourth and third metal layers; and etching said second and first metal layers with a mask of said second insulating layer and said sidewall insulating layer, said high melting temperature metals including at least one of titanium, a titanium alloy, tungsten and a tungsten alloy.

10. A method for manufacturing a connection layer, comprising the steps of:

forming an impurity region in a semiconductor substrate;

forming a first insulating layer on the semiconductor substrate;

forming an opening in said insulating layer, said opening reaching said impurity region;

forming a first high melting temperature metal layer on said first insulating layer, said first high melting temperature metal layer having a contact characteristic for contact to said first insulating layer;

forming a second high melting temperature metal layer on said first metal layer, said second high melting temperature metal having a step coverage characteristic;

forming a non-high melting temperature metal layer on said second high melting temperature metal layer, said non-high temperature metal layer having a high conductivity;

forming a third high melting temperature metal layer on said non-high melting temperature metal layer;

forming a second insulating layer on said third high melting temperature metal layer, said third metal layer having a contact characteristic for contact to said second insulating layer;

forming a photoresist layer;

patterning said photoresist layer;

etching said second insulating layer, said third metal layer and said non-high melting temperature metal layer with a mask of said patterned photoresist layer;

removing said patterned photoresist layer;

forming a third insulating layer;

etching back said third insulating layer to form a sidewall insulating layer on a side of said third metal layer and said non-high melting temperature layer; and etching said second and first metal layers with a mask of said second insulating layer and said sidewall insulating layer, said first, second and third high melting temperature metal layers each including at least one of titanium, a titanium alloy, tungsten and a tungsten alloy, said non-high melting temperature metal layer including at least one of aluminium and an aluminium alloy.

11. A method as set forth in claim 10, wherein said first high melting temperature metal layer is made of titanium tungsten, said second high melting temperature metal layer is made of tungsten, said non-high melting temperature metal layer is made of aluminium alloy, and said third high melting temperature metal layer is made of titanium tungsten.

12. A method as recited in claim 1, wherein said etching steps are carried out using a dry etching process.

13. A method as recited in claim 5, wherein said etching steps are carried out using a dry etching process.

14. A method as recited in claim 9, wherein said etching steps are carried out using a dry etching process.

15. A method as recited in claim 10, wherein said step of etching said second insulating layer, said third metal layer and said non-high melting temperature metal layer is carried out using a dry etching process.

16. A method as recited in claim 10, wherein said step of etching said second insulating layer and said sidewall insulating layer is carried out using a dry etching process.

* * * * *